United States Patent
Derner

[19]

[11] Patent Number: 6,108,804
[45] Date of Patent: Aug. 22, 2000

[54] METHOD AND APPARATUS FOR TESTING ADJUSTMENT OF A CIRCUIT PARAMETER

[75] Inventor: Scott Derner, Boise, Id.

[73] Assignee: Micron Technology, Inc., Boise, Id.

[21] Appl. No.: 08/927,164

[22] Filed: Sep. 11, 1997

[51] Int. Cl.[7] ................................................. G01R 31/28
[52] U.S. Cl. ............................ 714/721; 714/733; 324/416
[58] Field of Search ........................... 714/43, 721, 733;
347/62; 365/195, 225.7; 324/73 R, 416;
345/515; 307/115; 327/408, 525, 530

[56] References Cited

U.S. PATENT DOCUMENTS

| | | | |
|---|---|---|---|
| 3,978,477 | 8/1976 | Schmitz | 345/515 |
| 4,739,250 | 4/1988 | Tanizawa | 324/73 R |
| 5,361,001 | 11/1994 | Stolfa | 327/530 |
| 5,450,030 | 9/1995 | Shin et al. | 327/525 |
| 5,517,455 | 5/1996 | McClure et al. | 365/225.7 |
| 5,563,546 | 10/1996 | Tsukada | 327/408 |
| 5,646,948 | 7/1997 | Kobayashi et al. | 365/195 |
| 5,742,307 | 4/1998 | Watrobski et al. | 347/62 |
| 5,815,511 | 9/1998 | Yamamoto | 714/43 |
| 5,838,076 | 11/1998 | Zarrabian et al. | 307/115 |

*Primary Examiner*—Albert De Cady
*Assistant Examiner*—David Ton
*Attorney, Agent, or Firm*—Dorsey & Whitney LLP

[57] ABSTRACT

A voltage regulator is disclosed which is coupled with a programmable trimming circuit by a trim test circuit. When disabled, the trim test circuit passes the logic states of the signals produced by the trimming circuit to the voltage regulator. When enabled, the trim test circuit applies signals to the voltage regulator which correspond with asserted logic states of signals producible by the trimming circuit. Thus, the effect of the trimming circuit on the voltage regulator is testable without actual programming of the trimming circuit.

33 Claims, 3 Drawing Sheets

METHOD AND APPARATUS FOR TESTING ADJUSTMENT OF A CIRCUIT PARAMETER

TECHNICAL FIELD

This invention relates generally to integrated circuits having adjustable circuit parameters, and more particularly, to methods and apparatus for testing adjustment of these circuit parameters.

BACKGROUND OF THE INVENTION

During manufacture of integrated circuits, a wide variety of operating characteristics and circuit functions are tested. Because integrated circuit fabrication involves a number of process steps, variations in circuit parameters are commonplace. Thus, integrated circuits are commonly designed to include adjustable circuit parameters, in which adjustment of these parameters occurs following completed fabrication. For example, many integrated circuits include a voltage regulator which receives an externally applied supply voltage and produces a regulated supply voltage for use by other circuitry internal to the integrated circuit. The magnitude of this internal supply voltage is typically adjusted following completed fabrication of the integrated circuit to provide a regulated voltage at the appropriate operating level.

FIG. 1 depicts a voltage regulator 10 of the type used in a wide variety of integrated circuits. The voltage regulator 10 includes a voltage reference circuit 12 and a power stage circuit 14, whose configuration and operation are well known to those skilled in the art. The voltage reference circuit 12 receives an input voltage $V_{IN}$ which is a function of the externally applied supply voltage $V_{CCX}$, as described below. The voltage reference circuit 12 then produces a reference voltage output $V_{REF}$ which is input to the power stage circuit 14. The power stage circuit 14 correspondingly produces a regulated supply voltage $V_{CCR}$ for powering other circuits internal to the integrated circuit in which the voltage regulator 10 is included.

Diodes D1 and D2 are connected in series between the external supply voltage $V_{CCX}$ and a node between the power stage circuit 14 and the voltage reference circuit 12. As will be understood by those skilled in the art, these diodes are used during burn-in testing, essentially clamping the voltage of the node to a fixed level below $V_{CCX}$, once $V_{CCX}$ exceeds an expected operating range.

A plurality of transistors T1–T4 is connected in series with a resistor R between the external supply voltage $V_{CCX}$ and ground potential. As depicted, each of the transistors T1–T4 is a PMOS transistor with its gate connected to ground potential. Typically, these transistors have the same channel width and different channel lengths, and these transistors function essentially like resistors. Each of the transistors T1–T4 is connected to a corresponding one of shunting elements S1–S4, which are switching PMOS transistors connected in parallel with the corresponding transistor. In response to a corresponding one of signals FUSE1*–FUSE4* applied to its gate, each of the shunting elements S1–S4 can selectively electrically bypass the corresponding one of the transistors T1–T4, thereby selectively varying the resistance provided by the transistors. The input voltage $V_{IN}$ applied to the voltage reference circuit 12 is produced at a node between the resistor R and the transistors T1–T4. Depending on which of the transistors T1–T4 is electrically shunted, if any, the magnitude of the input voltage $V_{IN}$ is correspondingly adjusted. This affects the magnitude of the produced reference voltage $V_{REF}$, which in turn affects the regulated internal supply voltage $V_{CCR}$.

A trimming circuit 16 includes a plurality of programmable fuse elements F1–F4. Each of the fuse elements F1–F4 is connected in series with a corresponding one of a plurality of transistors 18 between the external supply voltage $V_{CCX}$ and ground potential. As depicted, each of the transistors 18 is a PMOS transistor with its gate tied to ground potential and acts as a pull-up transistor. The trimming circuit 16 also includes a plurality of inverters 20, each of which has its input connected to a node between the corresponding fuse element F1–F4 and transistor 18. The output signal produced by each of the inverters 20 is the corresponding one of the signals FUSE1*–FUSE4*. When, for example, the fuse element F1 is programmed (i.e., is blown), the input to the corresponding inverter 20 is held at a high logic state, and the signal FUSE1* is then asserted at a low logic state. When the fuse element F1 is not programmed, the input to the inverter 20 is then held at a logic low state, and the output signal FUSE1* is correspondingly deasserted.

During mass production of integrated circuits having a trimmable voltage regulator like that depicted in FIG. 1, measurements of the various producible $V_{CCR}$ magnitudes are recorded. Typically, fuse elements are blown and the resulting effect on regulator output is recorded in what is called a trim table. The trim table is usually created by hand measurement of the change in $V_{CCR}$ resulting from each fuse that is blown. For some relatively unstable fabrication processes, the resulting trim table can vary widely from lot to lot, wafer to wafer, and even from die to die. Creation of trim tables is time consuming, and many die may be tested to create an accurate trim table for an entire lot. Also, during creation of trim tables, the value of the regulated supply voltage $V_{CCR}$ is necessarily permanently altered on those die being tested. Thus, significant inefficiencies exist in current methods of testing and trimming integrated circuits.

SUMMARY OF THE INVENTION

In accordance with the principles of the present invention, an integrated circuit is provided which includes a primary circuit, a programmable trimming circuit, and a test circuit. The primary circuit has an adjustable circuit parameter, and the programmable trimming circuit is coupled with the primary circuit to apply a first trimming signal to adjust the primary circuit parameter. A test circuit is also coupled with the primary circuit, and is operable to apply a second trimming signal to the primary circuit to test adjustment of the primary circuit parameter. The programmable trimming circuit may be coupled with the primary circuit by the test circuit, with the test circuit passing the first trimming signal to the primary circuit when the test circuit is disabled. When enabled, the test circuit may then block the first trimming signal and substitute therefor the second trimming signal. The primary circuit may be included within a memory device, which in turn may be included within a computer system.

DETAILED DESCRIPTION OF THE INVENTION

In the following description, certain specific details are set forth in order to provide a thorough understanding of various embodiments of the present invention. However, those skilled in the art will understand that the present invention may be practiced without these details. In other instances, well-known circuit structures and configurations have not been shown in detail in order not to unnecessarily obscure the description of the embodiments of the invention.

Figure 1:
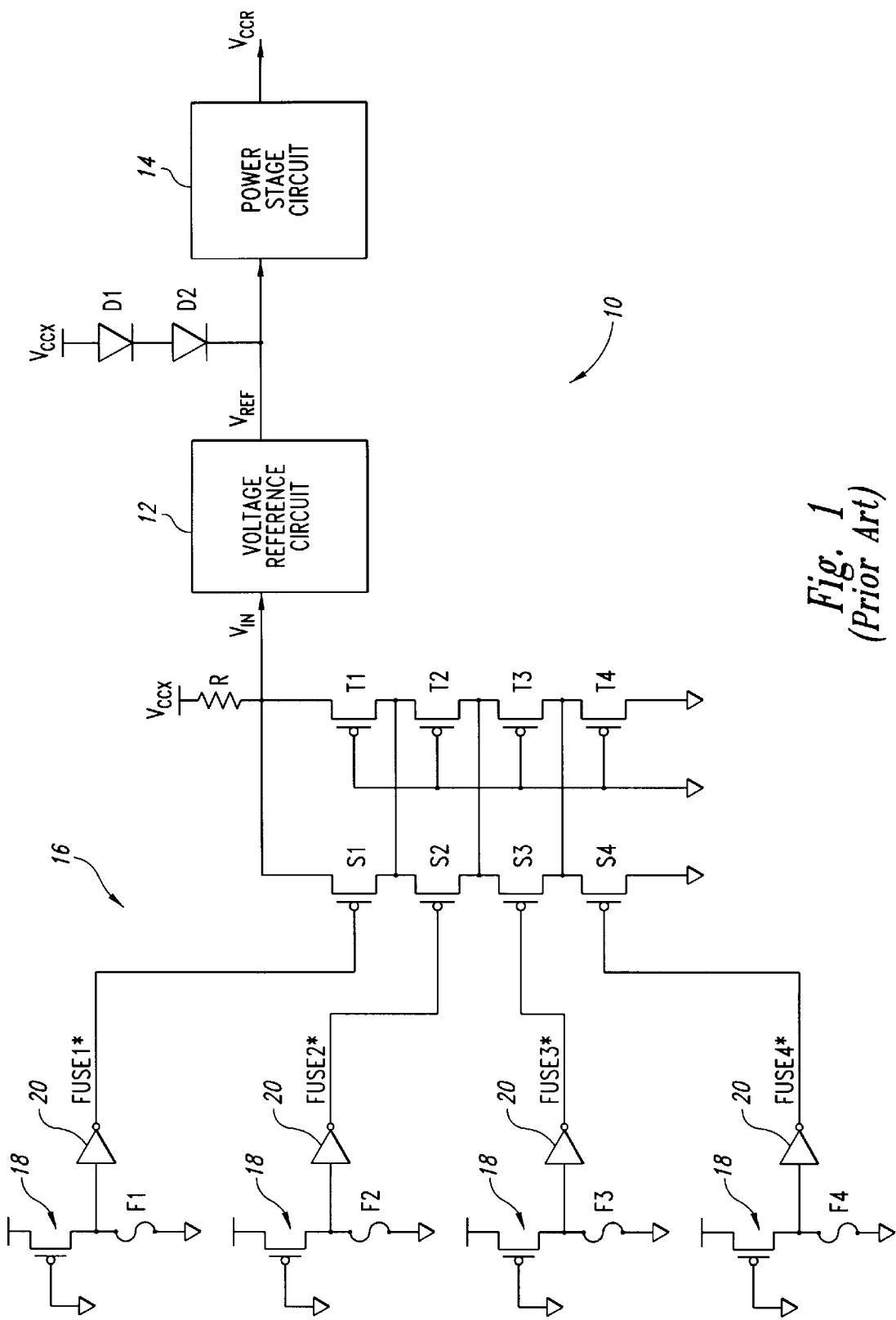
FIG. 1 is a part block, part schematic diagram depicting a voltage regulator and a trimming circuit in accordance with the prior art.
Figure 2:
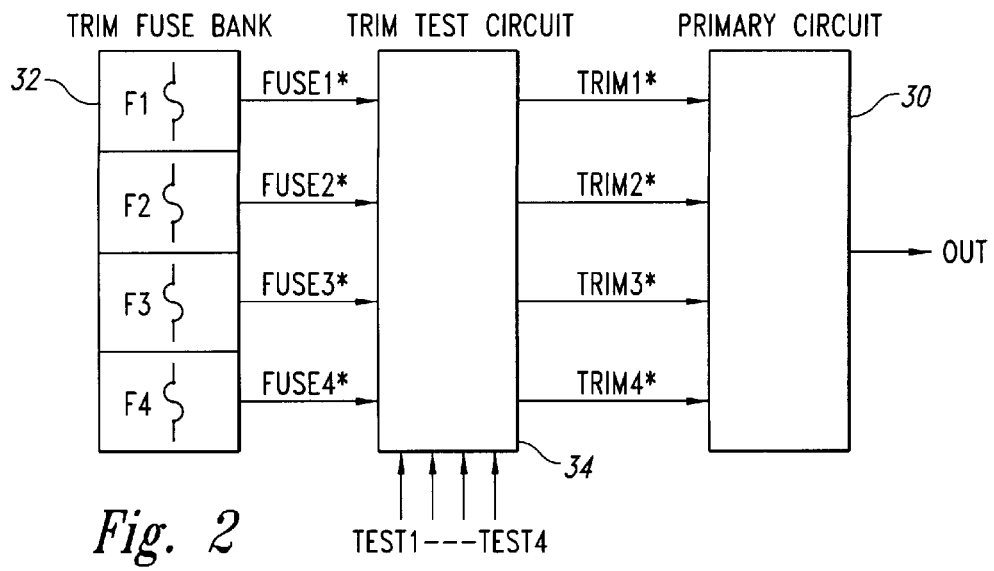
FIG. 2 is a functional block diagram depicting a trimmable primary circuit coupled with a trimming circuit and a trim test circuit in accordance with an embodiment of the present invention.

FIG. 2 is a functional block diagram of an integrated circuit that includes a primary circuit 30 having an adjustable circuit parameter, such as an output signal OUT. A programmable trimming circuit, such as a trim fuse bank 32, is coupled with the primary circuit 30 by a trim test circuit 34 to adjust the primary circuit parameter OUT. The trim fuse bank includes non-volatile programmable elements, such as fuses F1–F4, whose various combinations of programmed states affect the value of the adjustable primary circuit parameter OUT. Depending upon the programmed state (i.e., blown or unblown) of the fuses F1–F4, a corresponding logic state of respective signals FUSE1*–FUSE4* is produced by the trim fuse bank 32.

The trim test circuit 34 receives the signals FUSE1*–FUSE4*, and also receives test signals TEST1–TEST4. The test signals TEST1–TEST4 may be produced by other circuitry (not shown) included in the integrated circuit, or may be externally applied to test pads on a fabricated die containing the integrated circuit. The trim test circuit 34 produces trimming signals TRIM1*–TRIM4*, each of which has a logic state determined by the combination of logic states of respective ones of the FUSE1*–FUSE4* signals and the TEST1–TEST4 signals. In accordance with one embodiment of the present invention, the effect of the various combinations of blown and unblown states of the fuses F1–F4 is testable, without actually blowing any fuses, by applying corresponding combinations of first and second logic states of the test signals TEST1–TEST4.

Figure 3A:
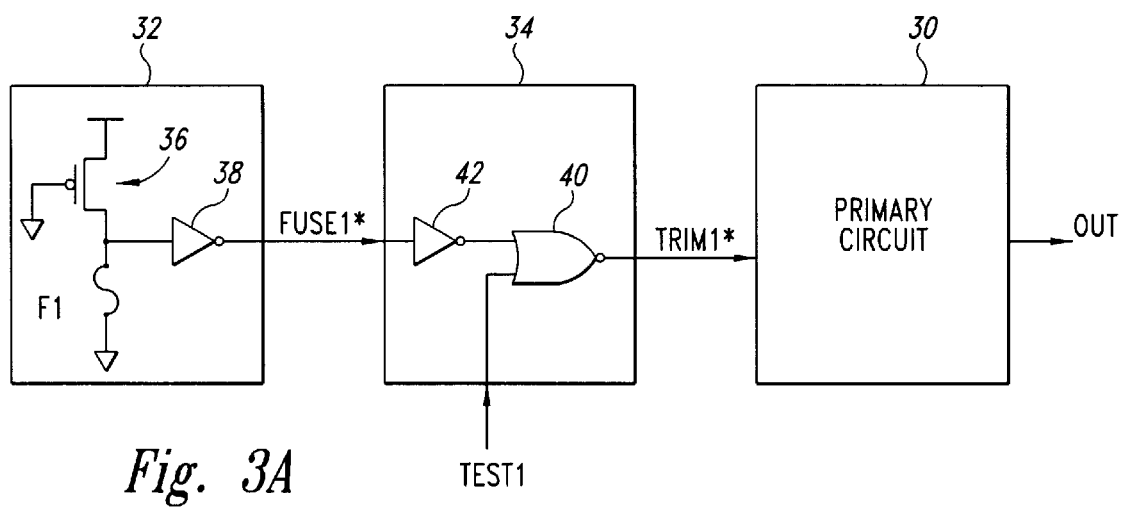
FIG. 3A is a part block, part schematic, part logic diagram depicting exemplary portions of the circuitry depicted in FIG. 2.

FIG. 3A depicts exemplary portions of the circuitry shown in FIG. 2. The example portion of the trim fuse bank 32 shown is similar to that described above in connection with the prior art. Included is the fuse F1 connected in series with a PMOS transistor 36 between supply and ground potentials. The input of an inverter 38 is connected to a node between the fuse F1 and the transistor 36, and the output of the inverter produces the signal FUSE1*. The example portion of the trim test circuit 34 includes a NOR gate 40 and an inverter 42. The input of the inverter 42 receives the FUSE1* signal, and the output of the inverter 42 is applied to one of two inputs of the NOR gate 40. The second of the inputs to the NOR gate 40 receives the test signal TEST1, and the output of the NOR gate produces the trimming signal TRIM1*.

The logic state of the trim signal TRIM1* is determined by the combination of logic states of the FUSE1* and TEST1 signals. When the logic state of the TEST1 signal is low, the NOR gate 40 functions essentially as an inverter, and the logic state of the TRIM1* signal is the same as that of the FUSE1* signal. Thus, a logic low or deasserted state of the TEST1 signal functionally passes the logic state of the FUSE1* signal through the trim test circuit 34 to the primary circuit 30. When the TEST1 signal is asserted (i.e., a logic high state), the output of the NOR gate 40 is a logic low state independent of the logic state of the FUSE1* signal. Thus, an asserted TEST1 signal asserts the TRIM1* signal (i.e., a logic low state). This mimics the effect of an asserted FUSE1* signal when the test circuit 34 is disabled.

Those skilled in the art will appreciate a number of important advantages achieved by the trim test circuit 34 described in connection with FIGS. 2 and 3A. For example, the effect on the primary circuit 30 of a blown or unblown fuse is testable electronically, without actually blowing any fuses. Thus, testing integrated circuit production lots may be conveniently performed automatically and electronically, and fuses need only be blown when producing the end product—namely, the primary circuit 30 having the desired circuit parameter value. Trim tables may be easily produced, and can even be produced for each die, without sacrifice of any of the die.

Those skilled in the art will appreciate that any of a wide variety of circuit components and configurations may be substituted for those particular components and configurations described above in connection with FIGS. 2 and 3A. For example, any of a wide variety of non-volatile programmable elements may be employed in place of the described fuses. Further, the trim test circuit 34 or functional equivalent need not itself be coupled between the programmable trimming circuit 32 and the primary circuit 30. Those skilled in the art will appreciate a number of alternative configurations, in which the trim test circuit 34 tests the effect on the primary circuit 30 of the logic state combinations producible by the trimming circuit 32. Also, any of a wide variety of circuit components and configurations could be substituted for the particular NOR gate 40 and inverter 42 included in the exemplary portion of the trim test circuit 34.

Figure 3B:
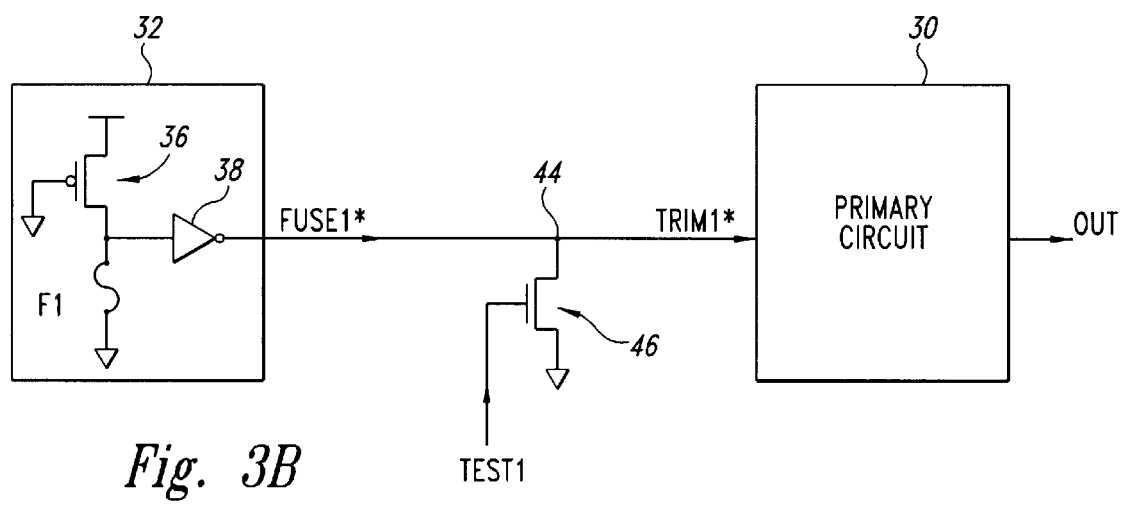
FIG. 3B is a part block, part schematic diagram depicting an alternate embodiment of the present invention.

FIG. 3B shows an alternative approach to testing the effect of the logic state combinations producible by the trimming circuit 32 on the primary circuit 30. In this case, the primary circuit 30 and the trimming circuit 32 are connected directly to each other at a node 44. A transistor 46 is connected in series between the node 44 and ground potential. The test signal TEST1 is applied to the gate of the transistor 46. When the test signal TEST1 is asserted, the transistor 46 pulls down the potential of the node 44, thereby asserting the trim signal TRIM1*. This mimics the effect of an asserted FUSE1* signal during normal non-test operations (i.e., when TEST1 is deasserted).

Figure 4:
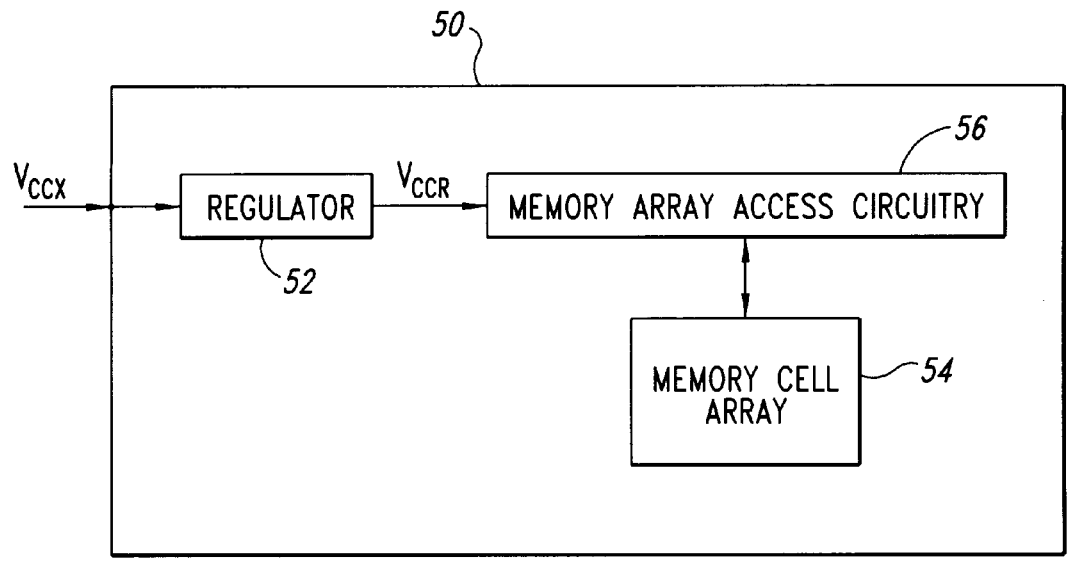
FIG. 4 is a functional block diagram depicting a memory device in accordance with an embodiment of the present invention.

One important application of a primary circuit having an adjustable circuit parameter is that of a voltage regulator producing an adjustable regulated voltage. FIG. 4 depicts one such application, showing a memory device 50 having a trimmable voltage regulator 52 constructed in accordance with the present invention. The voltage regulator 52 receives an external supply voltage $V_{CCX}$ applied to the memory device 50. The voltage regulator 52 then produces a regulated internal supply voltage $V_{CCR}$ which is adjustable in accordance with embodiments of the invention described above in connection with FIGS. 2, 3A and 3B. The regulated internal supply voltage $V_{CCR}$ is used for powering other circuitry included in the memory device 50. Such circuitry includes a memory cell array 54, for storing data, and memory array access circuitry 56, for reading data from and writing data to the memory cell array. The memory array access circuitry 56 includes circuitry such as row and column address decode circuitry, sense amplifier and I/O gating circuitry, and data input and output circuitry. The memory array access circuitry 56 and voltage regulator 52 are included in what is commonly called peripheral circuitry of the memory device 50. Of course, those skilled in the art will appreciate that the present invention may be applied to any of a wide variety of circuits, including a wide variety of memory devices.

Figure 5:
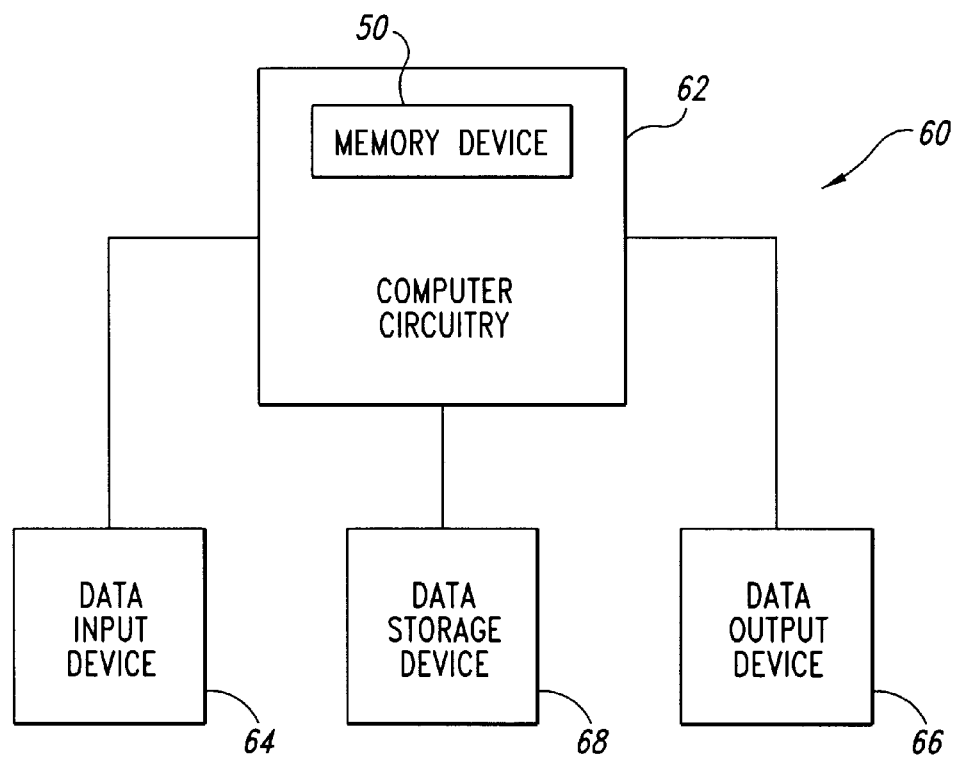
FIG. 5 is a functional block diagram depicting a computer system having the memory device of FIG. 4.

FIG. 5 is a functional block diagram of a computer system 60 having the memory device 50 of FIG. 4. The computer system 60 includes computer circuitry 62 for such computer functions as executing software to perform desired calculations and tasks. The computer circuitry 62 typically includes a processor (not shown) and the memory device 50 as shown. One or more data input devices 64 is coupled to the computer circuitry 62 to allow an operator (not shown) to manually input data (including instructions) to the computer system 60. Examples of data input devices 64 include a keyboard and a pointing device. One or more data output devices 66 is coupled to the computer circuitry 62 to provide data to the operator. Examples of data output devices 66 include a printer and a video display unit. One or more data storage devices 68 is coupled to the computer circuitry 62 to store data and/or retrieve data from external storage media (not shown). Examples of storage devices 68 and associated storage media include drives that accept floppy and hard disks, magnetic tape recorders, and compact-disk read-only memory (CD-ROM) readers.

It will be appreciated that, although specific embodiments of the invention have been described herein for purposes of illustration, various modifications may be made without deviating from the spirit and scope of the invention. Numerous variations are well within the scope of the invention.

Accordingly, the invention is not limited except as by the appended claims.

What is claimed is:

1. A integrated circuit, comprising:
    a primary circuit having an adjustable circuit parameter;
    a trimming circuit coupled with the primary circuit and operable to apply a first trimming signal to the primary circuit to adjust the primary circuit parameter; and
    a test circuit coupled with the primary circuit and having enabled and disabled modes, the test circuit in the enabled mode being operable to apply a second trimming signal to the primary circuit to test adjustment of the primary circuit parameter.

2. The integrated circuit of claim 1 wherein the trimming circuit is coupled with the primary circuit by the test circuit, the test circuit in the disabled mode being operable to pass the first trimming signal to the primary circuit.

3. The integrated circuit of claim 1 wherein the trimming circuit is coupled with the primary circuit by the test circuit, the test circuit in the enabled mode being operable to block the first trimming signal and to substitute therefor the second trimming signal.

4. The integrated circuit of claim 1 wherein the trimming circuit includes a nonvolatile programmable element having first and second programmable states.

5. The integrated circuit of claim 4 wherein the nonvolatile programmable element is a fuse.

6. The integrated circuit of claim 1 wherein the trimming circuit is coupled with the primary circuit by the test circuit, the test circuit receiving the first trimming signal and a test signal and producing the second trimming signal in response thereto, the second trimming signal having a logic state which is a function of the combination of logic states of the first trimming signal and the test signal.

7. The integrated circuit of claim 6 wherein the test circuit includes a NOR gate operable to receive input signals having logic states corresponding with the logic states of the first trimming signal and the test signal.

8. The integrated circuit of claim 1 wherein the primary circuit produces an output signal and the adjustable circuit parameter is the magnitude of the output signal.

9. The integrated circuit of claim 8 wherein the primary circuit is a voltage regulator and the output signal is a regulated voltage.

10. The integrated circuit of claim 9 wherein the magnitude of the regulated voltage is adjusted as a function of a logic state combination of a plurality of trimming signals received by the voltage regulator.

11. A integrated circuit, comprising:
    a trimming circuit operable to produce a first trimming signal;
    a test circuit having enabled and disabled modes, the test circuit in the enabled mode being operable to produce a second trimming signal; and
    a primary circuit having an adjustable circuit parameter and being coupled with the trimming circuit and with the test circuit, the primary circuit being operable to receive one of the first and second trimming signals and to adjust the circuit parameter in response thereto.

12. The integrated circuit of claim 11 wherein the trimming circuit is coupled with the primary circuit by the test circuit, the test circuit in the disabled mode being operable to pass the first trimming signal to the primary circuit.

13. The integrated circuit of claim 11 wherein the trimming circuit is coupled with the primary circuit by the test circuit the test circuit in the enabled mode being operable to block the first trimming signal and to substitute therefor the second trimming signal.

14. The integrated circuit of claim 11 wherein the trimming circuit is coupled with the primary circuit by the test circuit, the test circuit receiving the first trimming signal and a test signal and producing the second trimming signal in response thereto, the second trimming signal having a logic state which is a function of the combination of logic states of the first trimming signal and the test signal.

15. The integrated circuit of claim 11 wherein the primary circuit is a voltage regulator producing a regulated voltage, the adjustable circuit parameter being the magnitude of the regulated voltage.

16. An integrated circuit, comprising:
    a voltage regulator operable to produce a regulated voltage, the voltage regulator being further operable to receive a plurality of regulator trimming signals, each having first and second logic states, the magnitude of the regulated voltage being determined by the combination of logic states of the regulator trimming signals;
    a programmable trimming circuit coupled with the voltage regulator and operable to produce a first set of trimming signals, the programmable trimming circuit having a plurality of programmable elements, each having first and second programmed states, the logic state of each of the first set of trimming signals being determined by the programmed state of a corresponding one of the programmable elements;
    a trim test circuit coupled with the voltage regulator and operable to receive a plurality of test signals and to produce a second set of trimming signals in response thereto; and
    wherein the combination of logic states of the regulator trimming signals corresponds with the combination of logic states of one of the first and second sets of trimming signals.

17. The integrated circuit of claim 16 wherein the trim test circuit couples the programmable trimming circuit with the voltage regulator and is operable to receive the first set of trimming signals, and wherein the trim test circuit has first and second operating modes, the trim test circuit in the first operating mode producing the regulator trimming signals in the combination of logic states corresponding to the combination of logic states of the first set of trimming signals.

18. The integrated circuit of claim 16 wherein the trim test circuit couples the programmable trimming circuit with the voltage regulator and is operable to receive the first set of trimming signals, and wherein the trim test circuit has first and second operating modes, the trimming test circuit in the second operating mode producing the regulator trimming signals in the combination of logic states corresponding to the combination of logic states of the second set of trig signals.

19. The integrated circuit of claim 16 wherein the programmable elements are non-volatile programmable elements.

20. The integrated circuit of claim 16 wherein the programmable elements are fuses.

21. A memory device, comprising:

a memory cell array operable to store data;

peripheral circuitry coupled with the memory cell array and operable to to read data from and write data to the memory cell array, the peripheral circuitry having an adjustable circuit parameter;

a programmable trimming circuit coupled with the peripheral circuitry and operable to apply a first trimming signal to the peripheral circuitry to adjust the peripheral circuit parameter; and a test circuit coupled with the peripheral circuitry and having enabled and disabled modes, the test circuit in the enabled mode being operable to apply a second trimming signal to the peripheral circuitry to test adjustment of the peripheral circuitry parameter.

22. The memory device of claim 21 wherein the programmable trimming circuit is coupled with the peripheral circuitry by the test circuit, the test circuit in the disabled mode being operable to pass the first trimming signal to the peripheral circuitry.

23. The memory device of claim 21 wherein the programmable trimming circuit is coupled with the peripheral circuitry by the test circuit, the test circuit in the enabled mode being operable to block the first trimming signal and to substitute therefor the second trimming signal.

24. The memory device of claim 21 wherein the peripheral circuitry includes a voltage regulator operable to provide a regulated supply voltage to other components of the peripheral circuitry, and wherein the peripheral circuitry parameter is the magnitude of the regulated supply voltage.

25. The memory device of claim 24 wherein the trimming circuit includes a programmable fuse bank having a plurality of fuses, each of which can be in one of first and second programmed states, the magnitude of the regulated supply voltage being one of a plurality of values, each corresponding with a respective one of a plurality of combinations of the first and second programmed states of the fuses.

26. A computer system comprising:

a data input device;

a data output device; and computer circuitry coupled with the data input and data output devices and including a memory device having:

a memory cell array operable to store data;

peripheral circuitry coupled with the memory cell array and operable to to read data from and write data to the memory cell array, the peripheral circuitry having an adjustable circuit parameter;

a programmable trimming circuit coupled with the peripheral circuitry and operable to apply a first trimming signal to the peripheral circuitry to adjust the peripheral circuit parameter; and a test circuit coupled with the peripheral circuitry and having enabled and disabled modes, the test circuit in the enabled mode being operable to apply a second trimming signal to the peripheral circuitry to test adjustment of the peripheral circuitry parameter.

27. The computer system of claim 26 wherein the programmable trimming circuit is coupled with the peripheral circuitry by the test circuit, the test circuit in the disabled mode being operable to pass the first trimming signal to the peripheral circuitry.

28. The computer system of claim 26 wherein the programmable trimming circuit is coupled with the peripheral circuitry by the test circuit, the test circuit in the enabled mode being operable to block the first trimming signal and to substitute therefor the second trimming signal.

29. The computer system of claim 26, further comprising a data storage device coupled with the computer circuitry.

30. A integrated circuit, comprising:

a primary circuit having an adjustable circuit parameter;

a trimming circuit having an output terminal coupled with the primary circuit, a programmable element having a programmable state, and a test input terminal for receiving a test signal, the trimming circuit operable to apply a trim signal to adjust the primary circuit parameter having an output level that is a function of the test signal or the programmable state of the programmable element; and a test circuit having a control terminal coupled with the trimming circuit and having enabled and disabled modes, the test circuit in the enabled mode being operable to select the trimming circuit to apply the trim signal as a function of the test signal.

31. The integrated circuit of claim 30 wherein the programmable element comprises a non-volatile programmable element having first and second programmable states.

32. The integrated circuit of claim 31 wherein the non-volatile programmable element comprises a semiconductor fuse.

33. The integrated circuit of claim 30 wherein the primary circuit is a voltage regulator and the output signal is a regulated voltage.

* * * * *